United States Patent
Huang

(10) Patent No.: US 12,255,146 B2
(45) Date of Patent: Mar. 18, 2025

(54) INTERCONNECTION STRUCTURE WITH COMPOSITE ISOLATION FEATURE AND METHOD FOR MANUFACTURING THE SAME

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (CN)

(*) Notice: Subject to any disclaimer, the term of this patent is extended or adjusted under 35 U.S.C. 154(b) by 73 days.

(21) Appl. No.: 18/208,495

(22) Filed: Jun. 12, 2023

(65) Prior Publication Data
US 2024/0047361 A1 Feb. 8, 2024

Related U.S. Application Data

(62) Division of application No. 17/881,831, filed on Aug. 5, 2022.

(51) Int. Cl.
*H01L 23/532* (2006.01)
*H01L 21/768* (2006.01)
*H01L 23/528* (2006.01)

(52) U.S. Cl.
CPC ...... *H01L 23/5329* (2013.01); *H01L 21/7682* (2013.01); *H01L 23/528* (2013.01)

(58) Field of Classification Search
CPC ............... H01L 23/5329; H01L 23/528; H01L 23/5283; H01L 27/0207; H01L 21/7682; H01L 21/76802; H01L 21/76885; H01L 21/764; H01L 21/762; H01B 12/01; H10B 12/50
See application file for complete search history.

(56) References Cited

U.S. PATENT DOCUMENTS

| | | | | |
|---|---|---|---|---|
| 6,035,530 | A * | 3/2000 | Hong | H01L 23/5222 29/850 |
| 6,071,805 | A * | 6/2000 | Liu | H01L 21/7682 438/669 |
| 9,159,606 | B1 * | 10/2015 | Purayath | H01L 21/76882 |
| 2004/0099951 | A1 | 5/2004 | Park et al. | |
| 2015/0037980 | A1 * | 2/2015 | Rha | H01L 21/76832 438/700 |

(Continued)

FOREIGN PATENT DOCUMENTS

CN 102263083 A 11/2011
TW 202114213 A 4/2021

OTHER PUBLICATIONS

Office Action mailed on Jan. 29, 2024 related to Taiwanese Application No. 112108501.

*Primary Examiner* — Galina G Yushina
(74) *Attorney, Agent, or Firm* — Xuan Zhang

(57) ABSTRACT

A semiconductor device and method for manufacturing the same are provided. The semiconductor device includes a substrate, an interconnection structure, a first isolation feature, and a second isolation feature. The interconnection structure has a first lateral surface and a second lateral surface. The first isolation feature is disposed on the first lateral surface of the interconnection structure. The second isolation feature is disposed on the second lateral surface of the interconnection structure. The first isolation feature is different from the second isolation feature.

10 Claims, 13 Drawing Sheets

(56) References Cited

U.S. PATENT DOCUMENTS

| | | | |
|---|---|---|---|
| 2015/0221541 A1* | 8/2015 | Nemani | H01L 21/7684 |
| | | | 438/666 |
| 2016/0086966 A1* | 3/2016 | Jhang | H10B 43/40 |
| | | | 438/587 |
| 2019/0157146 A1 | 5/2019 | Briggs et al. | |
| 2019/0267279 A1* | 8/2019 | Cheng | H01L 23/5222 |
| 2021/0074578 A1* | 3/2021 | Chou | H10B 12/485 |
| 2021/0090939 A1* | 3/2021 | Huang | H10B 12/482 |
| 2023/0068760 A1* | 3/2023 | Huang | H01L 21/76877 |

\* cited by examiner

INTERCONNECTION STRUCTURE WITH COMPOSITE ISOLATION FEATURE AND METHOD FOR MANUFACTURING THE SAME

CROSS-REFERENCE TO RELATED APPLICATION

This application is a divisional application of U.S. Non-Provisional application Ser. No. 17/881,831 filed 5 Aug. 2022, which is incorporated herein by reference in its entirety.

TECHNICAL FIELD

The present disclosure relates to a semiconductor device and method for manufacturing the same, and more particularly to a semiconductor device including an interconnection structure with composite isolation features and method for manufacturing the same.

DISCUSSION OF THE BACKGROUND

With the rapid growth of electronic industry, the development of integrated circuits (ICs) has achieved high performance and miniaturization. Technological advances in IC materials and design have produced generations of ICs where each generation has smaller and more complex circuits than the previous generation.

A Dynamic Random Access Memory (DRAM) device is a type of random access memory that stores each bit of data in a separate capacitor within an integrated circuit. Typically, DRAM is arranged in a square array of one capacitor and transistor per cell. A vertical transistor has been developed for the $4F^2$ DRAM cell, where F stands for the photolithographic minimum feature width or critical dimension (CD). However, recently DRAM manufacturers face a tremendous challenge on shrinking the memory cell area as the word line spacing continues to shrink.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor device. The semiconductor device includes a substrate, an interconnection structure, a first isolation feature, and a second isolation feature. The interconnection structure has a first lateral surface and a second lateral surface. The first isolation feature is disposed on the first lateral surface of the interconnection structure. The second isolation feature is disposed on the second lateral surface of the interconnection structure. The first isolation feature is different from the second isolation feature.

Another aspect of the present disclosure provides another a first dielectric layer, a first interconnection structure, and a second interconnection structure. The first dielectric layer is disposed over the substrate. The first interconnection structure is disposed over the first dielectric layer. The second interconnection structure is disposed over the first dielectric layer. The first interconnection structure is spaced apart from the second interconnection structure by an air gap.

In some embodiments, the first interconnection structure comprises a first layer and a second layer different from the first layer.

In some embodiments, the first layer comprises a semiconductor material.

In some embodiments, the second layer comprises a semiconductor material.

In some embodiments, the semiconductor device further comprises: an isolation feature disposed over the first dielectric layer, wherein the first layer is in contact with the isolation feature, and the second layer is exposed to the air gap.

In some embodiments, the second interconnection structure comprises a third layer exposed the air gap, and a material of the third layer is the same as that of the second layer.

In some embodiments, the semiconductor device further comprises: a second dielectric layer disposed over the first interconnection structure, wherein a lateral surface of the second dielectric layer is exposed to the air gap.

In some embodiments, the semiconductor device further comprises: a third dielectric layer disposed over the second dielectric layer, wherein a lower surface of the third dielectric layer is exposed the air gap.

In some embodiments, the third dielectric layer has a protruding portion protruding toward the air gap.

In some embodiments, the lateral surface of the second dielectric layer is substantially coplanar with a lateral surface of the first interconnection structure.

In some embodiments, the lateral surface of the second dielectric layer is non-coplanar with a lateral surface of the first interconnection structure.

In some embodiments, a lateral surface of the first dielectric layer is exposed to the air gap.

Another aspect of the present disclosure provides a method for manufacturing a semiconductor device. The method includes: providing a substrate; forming a first dielectric layer over the substrate; forming a second dielectric layer over the first dielectric layer; patterning the first dielectric layer and the second dielectric layer to form an opening; forming an interconnection structure within the opening; and forming a third dielectric layer to form an air gap surrounded by the interconnection structure and the third dielectric layer.

In some embodiments, patterning the first dielectric layer and the second dielectric layer comprises: performing a first etching process to remove a first portion of the first dielectric layer and a first portion of the second dielectric layer; and performing a second etching process to remove a second portion of the first dielectric layer such that the first dielectric layer is recessed from a lateral surface of the second dielectric layer.

In some embodiments, the interconnection structure is formed on a lateral surface of the first dielectric layer.

In some embodiments, forming the interconnection structure comprises: forming a first layer on a lateral surface of the first dielectric layer and on the lateral surface of the second dielectric layer; removing the first layer on the lateral surface of the second dielectric layer; and forming a second layer on a lateral surface of the first layer.

In some embodiments, a lateral surface of the second layer is substantially coplanar with the lateral surface of the second dielectric layer.

The embodiments of the present disclosure a semiconductor device with a composite isolation feature around an interconnection structure. In this embodiment, the interconnection structure is made of at least two different materials. The interconnection structure may be proximal to two mediums with different dielectric constants. Such an asymmetry structure may be applied in semiconductor devices, such as a memory device, to control electrical properties.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
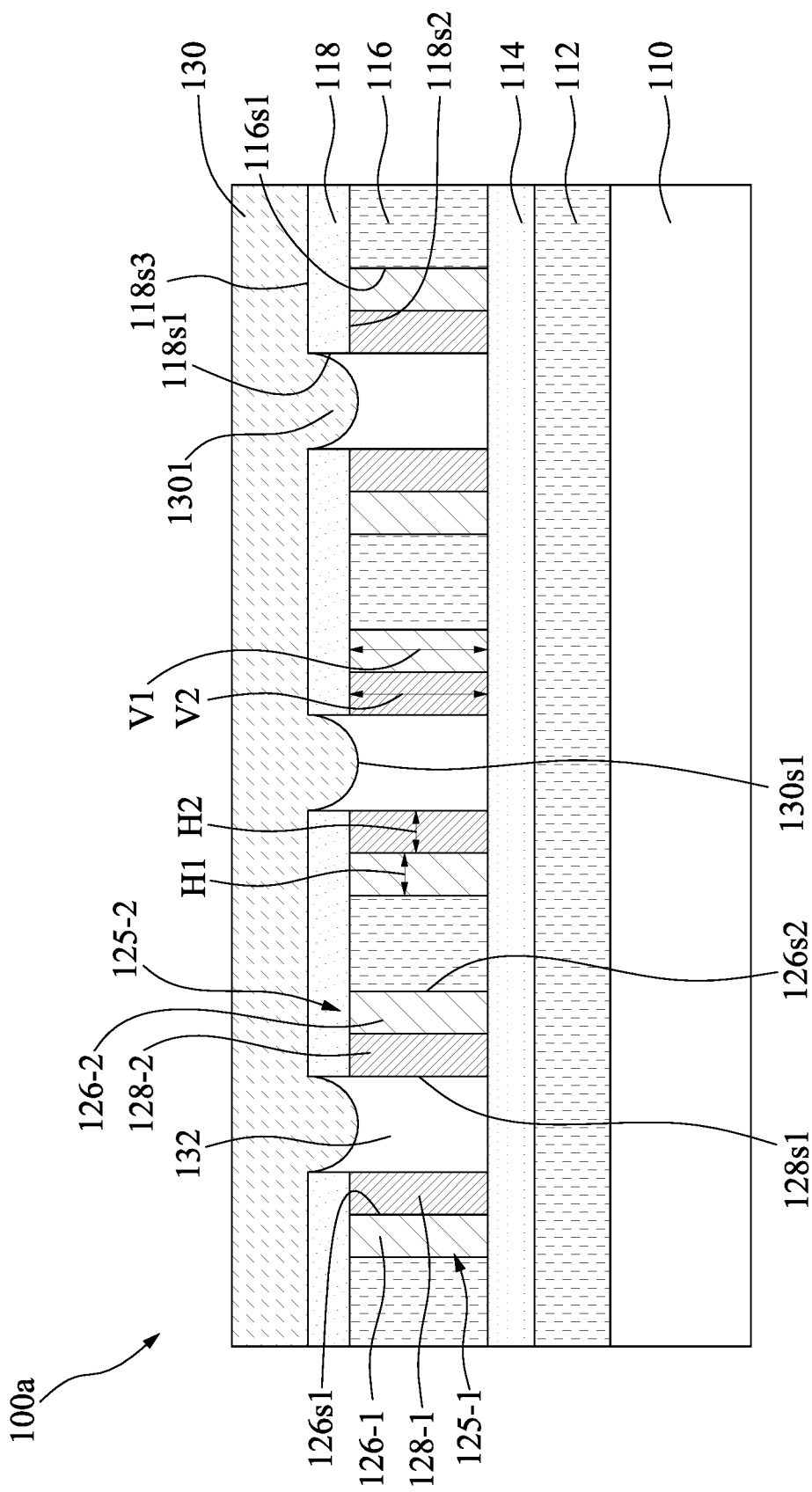
FIG. 1 is a cross-sectional view of a semiconductor device, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a cross-sectional view of a semiconductor device 100a, in accordance with some embodiments of the present disclosure.

In some embodiments, the semiconductor device 100a may include a substrate 110. The substrate 110 may be a semiconductor substrate, such as a bulk semiconductor, a semiconductor-on-insulator (SOI) substrate, or the like. The substrate 110 can include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of SiGe, GaAsP, AlInAs, AlGaAs, GaInAs, GaInP, and GaInAsP; any other suitable material; or a combination thereof. In some embodiments, the alloy semiconductor substrate may a SiGe alloy with a gradient Ge feature in which the Si and Ge composition changes from one ratio at one location to another ratio at another location of the gradient SiGe feature. In another embodiment, the SiGe alloy is formed over a silicon substrate. In some embodiments, a SiGe alloy can be mechanically strained by another material in contact with the SiGe alloy. In some embodiments, the substrate 110 may have a multilayer structure, or the substrate 110 may include a multilayer compound semiconductor structure.

In some embodiments, the semiconductor device 100a may include a dielectric layer 112. The dielectric layer 112 may be disposed on or over the substrate 110. The dielectric layer 112 may include a dielectric material, such as silicon oxide (SiO$_x$), silicon nitride (Si$_x$N$_y$), silicon oxynitride (SiON), phosphosilicate glass (PSG), borophosilicate glass (BPSG), a low-k dielectric material (k<4), a high-k dielectric material (k<4), or other suitable materials.

In some embodiments, the semiconductor device 100a may include a dielectric layer 114. The dielectric layer 114 may be disposed on or over the dielectric layer 112. The dielectric layer 114 may include a dielectric material, such as silicon nitride, silicon oxide, silicon oxynitride, phosphosilicate glass, borophosilicate glass, a low-k dielectric material, a high-k dielectric material, or other suitable materials. In some embodiments, the material of the dielectric layer 114 may be different from the dielectric layer 112.

Although not shown in FIG. 1, some features, such as transistors, diodes, and/or capacitors, may be formed within the substrate 110, dielectric layer 112, and/or dielectric layer 114. For example, gate structures, doped regions, and/or other conductive features may be formed within the substrate 110, dielectric layer 112, and/or dielectric layer 114.

In some embodiments, the gate structure may include a gate dielectric, which may include silicon oxide (SiO$_x$), silicon nitride (Si$_x$N$_y$), silicon oxynitride (SiON), or a combination thereof. In some embodiments, the gate dielectric layer can include dielectric material(s), such as high-k dielectric material. The high-k dielectric material may have a dielectric constant (k value) greater than 4. The high-k material may include hafnium oxide (HfO$_2$), zirconium oxide (ZrO$_2$), lanthanum oxide (La$_2$O$_3$), yttrium oxide (Y$_2$O$_3$), aluminum oxide (Al$_2$O$_3$), titanium oxide (TiO$_2$) or another applicable material. The gate structure may include a gate electrode. The gate electrode may include polysilicon, tungsten (W), copper (Cu), aluminum (Al), tantalum (Ta), molybdenum (Mo), tantalum nitride (TaN), titanium, titanium nitride (TiN), the like, and/or a combination thereof.

Doped regions may be doped with p type and/or n type dopants. In some embodiments, n type dopants may include arsenic (As), phosphorus (P), other group V elements, or any combination thereof. In some embodiments, p type dopants may include boron (B), other group III elements, or any combination thereof.

In some embodiments, the semiconductor device 100a may include a dielectric layer 116. The dielectric layer 116 may be disposed on or over the dielectric layer 114. The dielectric layer 116 may include a dielectric material, such as silicon oxide, silicon nitride, silicon oxynitride, phosphosilicate glass, borophosilicate glass, a low-k dielectric material, a high-k dielectric material, or other suitable materials. In some embodiments, the material of the dielectric layer 116 may be different from that of the dielectric layer 114. In some embodiments, the material of the dielectric layer 116 may be the same as that of the dielectric layer 112. The dielectric layer 116 may also be referred to as an isolation feature. The dielectric layer 116 may have a surface 116s1 (or a lateral surface).

In some embodiments, the semiconductor device 100a may include a dielectric layer 118. The dielectric layer 118 may be disposed on or over the dielectric layer 116. The dielectric layer 118 may include a dielectric material, such as silicon nitride, silicon oxide, silicon oxynitride, phosphosilicate glass, borophosilicate glass, a low-k dielectric material, a high-k dielectric material, or other suitable materials. In some embodiments, the material of the dielectric layer 118 may be different from that of the dielectric layer 116. In some embodiments, the material of the dielectric layer 118 may be the same as that of the dielectric layer 114. The dielectric layer 118 may have a surface 118s1 (or a lateral surface), a surface 118s2 (or a lower surface), and a surface 118s3 (or an upper surface). In some embodiments, the surface 118s1 of the dielectric layer 118 may be non-coplanar with the surface 116s1 of the dielectric layer 116. In some embodiments, the surface 116s1 of the dielectric layer 116 may be recessed from the surface 118s1 of the dielectric layer 118.

In some embodiments, the semiconductor device 100a may include interconnection structures 125-1 and 125-2. The interconnection structure 125-2 may be disposed adjacent to the interconnection structure 125-1. In some embodiments, each of the interconnection structures 125-1 and 125-2 may be disposed on the surface 116s1 of the dielectric layer 116. In some embodiments, each of the interconnection structures 125-1 and the interconnection structure 125-2 may be covered by the dielectric layer 118. Each of the interconnection structures 125-1 and the interconnection structure 125-2 may be configured to serve as a part of a conductive path or a channel transmitting carriers, such as holes and/or electrons. In some embodiments, the interconnection structure 125-1 may include layers 126-1 and 128-1. In some embodiments, the interconnection structure 125-2 may include layers 126-2 and 128-2.

The layer 126-1 may be disposed on the surface 116s1 of the dielectric layer 116. In some embodiments, the layer 126-1 may be in contact with the surface 116s1 of the dielectric layer 116. In some embodiments, the layer 126-1 may extend between the dielectric layer 114 and the dielectric layer 118. In some embodiments, the layer 126-1 may include a semiconductor material, such as silicon (Si), silicon-germanium (SiGe), or other suitable materials. In some embodiments, the layer 126-1 may include a conductive material, such as tungsten, copper, aluminum, tantalum, tantalum nitride, titanium, titanium nitride, the like, and/or a combination thereof.

The layer 126-2 may be disposed on the surface 116s1 of the dielectric layer 116. In some embodiments, the layer 126-2 may be in contact with the surface 116s1 of the dielectric layer 116. In some embodiments, the layer 126-2 may extend between the dielectric layer 114 and the dielectric layer 118. In some embodiments, the material of the layer 126-2 may be the same as that of the layer 126-1. Each of the layer 126-1 and the layer 126-2 may have a surface 126s1 and a surface 126s2 opposite to the surface 126s1. Each of the surface 126s1 and the surface 126s2 may also be referred to as a lateral surface. In some embodiments, the dielectric layer 116 may be disposed on the surface 126s2 of the layer 126-1.

The layer 128-1 may be disposed on the surface 126s1 of the layer 126-1. In some embodiments, the layer 128-1 may be in contact with the surface 126s1 of the layer 126-1. In some embodiments, the layer 128-1 may extend between the dielectric layer 114 and the dielectric layer 118. In some embodiments, the layer 128-1 may include a semiconductor material, germanium (Ge) or other suitable materials. In some embodiments, the layer 128-1 may include a conductive material, such as tungsten, copper, aluminum, tantalum, tantalum nitride, titanium, titanium nitride, the like, and/or a combination thereof. In some embodiments, the material of the layer 128-1 may be different from that of the layer 126-1.

The layer 128-2 may be disposed on the surface 126s1 of the layer 126-2. In some embodiments, the layer 128-2 may be in contact with the surface 126s1 of the layer 126-2. In some embodiments, the layer 128-2 may extend between the dielectric layer 114 and the dielectric layer 118. In some embodiments, the material of the layer 128-2 may be the same as that of the layer 128-1. In some embodiments, the layer 128-1 may face the layer 128-2. Each of the layers 128-1 and 128-2 may have a surface 128s1 (or a lateral surface). In some embodiments, the surface 128s1 of the layer 128 may be substantially coplanar with the surface 118s1 of the dielectric layer 118. In some embodiments, a roughness of the surface 118s1 of the dielectric layer 118 may be different from that of the surface 128s1 of the layer 128.

Each of the layer 126-1 and the layer 126-2 may have a horizontal dimension H1 (e.g., length, thickness, and/or width). Each of the layer 128-1 and the layer 128-2 may have a horizontal dimension H2 (e.g., length, thickness, and/or width). Each of the layer 126-1 and the layer 126-2 may have a vertical dimension V1 (e.g., length, thickness, and/or width). Each of the layer 128-1 and the layer 128-2 may have a vertical dimension V2 (e.g., length, thickness, and/or width). In some embodiments, the horizontal dimension H1 of the layer 126-1 may be substantially the same as the horizontal dimension H2 of the layer 128-1. In some embodiments, the vertical dimension V1 of the layer 126-1 may be substantially the same as the vertical dimension V2 of the layer 128-1.

In some embodiments, the semiconductor device 100a may include a dielectric layer 130. The dielectric layer 130 may be disposed on or over the dielectric layer 118. The dielectric layer 130 may cover the surface 118s3 of the dielectric layer 118. The dielectric layer 130 may include a dielectric material, such as silicon oxide, silicon nitride, silicon oxynitride, phosphosilicate glass, borophosphosilicate glass, a low-k dielectric material, a high-k dielectric material, or other suitable materials. In some embodiments, the material of the dielectric layer 130 may be different from that of the dielectric layer 118. In some embodiments, the material of the dielectric layer 130 may be the same as that of the dielectric layer 116. The dielectric layer 130 may have a surface 130s1 (or a lower surface). In some embodiments, the surface 130s1 of the dielectric layer 130 may protrude toward the substrate 110. In some embodiments, the surface 130s1 may be a curved surface. In some embodiments, the dielectric layer 130 may have a protruding portion 1301. In some embodiments, the protruding portion 1301 may protrude toward the substrate 110. In some embodiments, the protruding portion 1301 of the dielectric layer 130 may be in contact with the surface 118s1 of the dielectric layer 118.

In some embodiments, the semiconductor device 100a may include air gaps 132. In some embodiments, the dielectric constant of the air gap 132 may be different from that of the dielectric layer 116. In some embodiments, the dielectric constant of the air gap 132 may be less than that of the dielectric layer 116. The air gap 132 may also be referred to as an isolation feature. In some embodiments, the air gap 132 may be defined by the interconnection structures (e.g., 125-1 or 125-2), the dielectric layer 130, and the dielectric layer 114. In some embodiments, each of the layer 128-1 and the layer 128-2 may be exposed to the air gap 132. In some embodiments, the surface 128s1 of the layer 128-1 (or 128-2) may be exposed to the air gap 132. In some embodiments, the interconnection structure 125-1 may be spaced apart from the interconnection structure 125-2 by the air gap 132. In some embodiments, the layer 128-1 may be spaced apart from the layer 128-2 by the air gap 132.

In some embodiments, a horizontal dimension (not annotated in the figures) of the air gap 132 may be greater than the horizontal dimension H1 of the layer 126-1. In some embodiments, a horizontal dimension (not annotated in the figures) of the dielectric layer 116 may be greater than the horizontal dimension H1 of the layer 126-1. In some embodiments, the horizontal dimension of the dielectric layer 116 may be the same as the horizontal dimension of the air gap 132. In some embodiments, the horizontal dimension of the dielectric layer 116 may be twice as big as the horizontal dimension H1 of the layer 126-1. In some embodiments, the horizontal dimension of the air gap 132 may be twice as big as the horizontal dimension H1 of the layer 126-1.

In this embodiment, the interconnection structure 125-1 (or 125-2) is made of at least two different materials. The interconnection structure 125-1 (or 125-2) may be proximal to two isolation features (e.g., dielectric layer 116 and air gap 132) with different dielectric constants. Such an asymmetry structure may be applied in semiconductor devices, such as a memory device, to control electrical properties.

Figure 2:
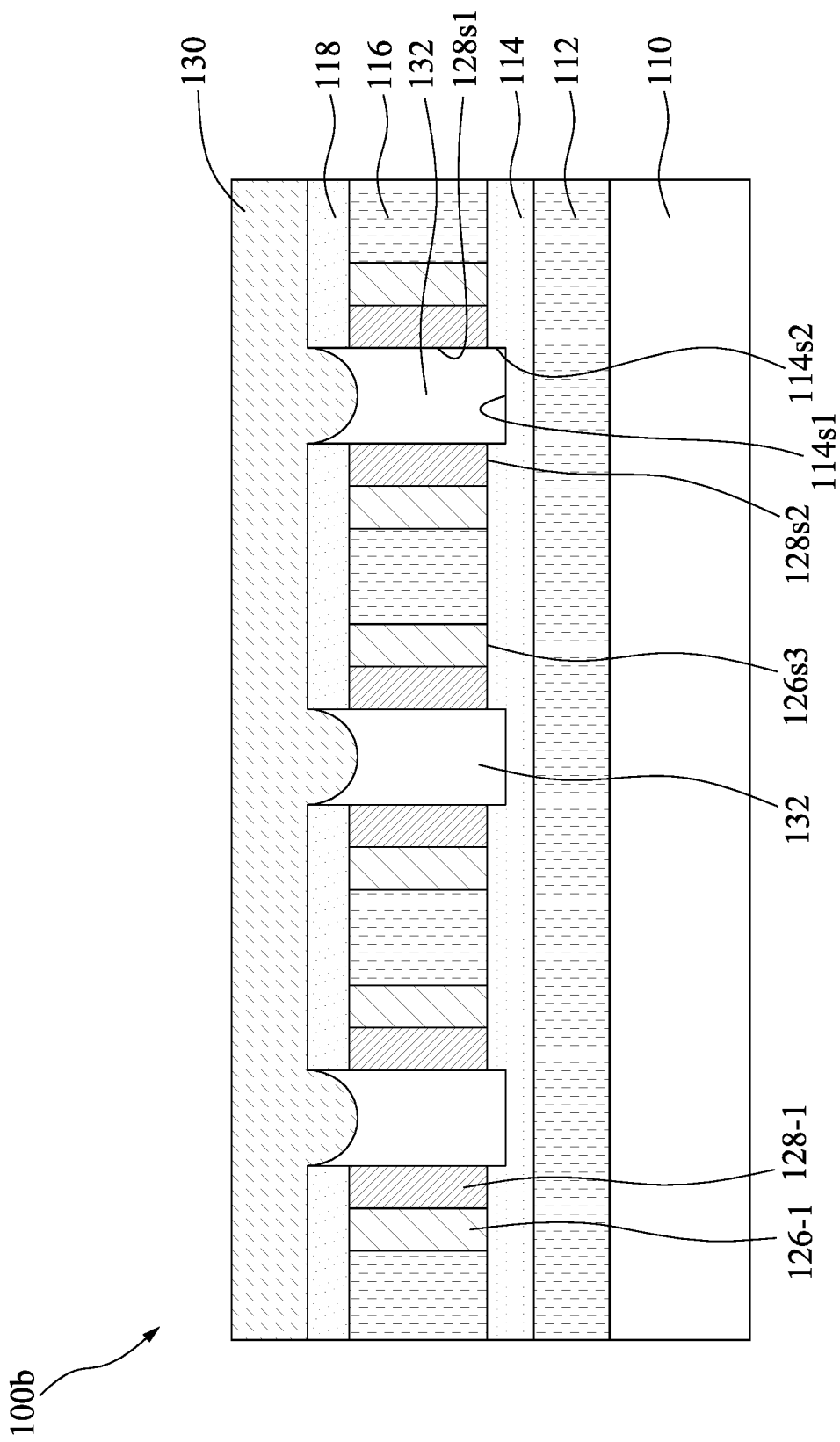
FIG. 2 is a cross-sectional view of a semiconductor device, in accordance with some embodiments of the present disclosure.

FIG. 2 is a cross-sectional view of a semiconductor device 100b, in accordance with some embodiments of the present disclosure. The semiconductor device 100b shown in FIG. 2 can be similar to the semiconductor device 100a shown in FIG. 1, differing in that the dielectric layer 114 of the semiconductor device 100b may have a recessed surface.

In some embodiments, the dielectric layer 114 may have a surface 114s1 and a surface 114s2. The surface 114s1 may also be referred to as an upper surface. The surface 114s2 may also be referred to as a lateral surface. The layer 126-1 may have a surface 126s3 (or a lower surface). The layer 128-1 may have a 128s2 (or a lower surface). In some embodiments, the surface 114s1 of the dielectric layer 114 may be non-coplanar with the surface 126s3 of the layer 126-1. In some embodiments, the surface 114s1 of the dielectric layer 114 may be lower than the surface 126s3 of the layer 126-1. In some embodiments, the surface 114s1 of the dielectric layer 114 may be non-coplanar with the surface 128s2 of the layer 128-1. In some embodiments, the surface 114s1 of the dielectric layer 114 may be lower than the surface 128s2 of the layer 128-1. In some embodiments, the surface 114s2 of the dielectric layer 114 may be substantially coplanar with the surface 128s1 of the layer 128. In some embodiments, the surface 114s2 of the dielectric layer 114 may be exposed to the air gap 132. In other words, a portion of a top surface of the dielectric layer 114 is exposed to the air gap 132.

Figure 3:
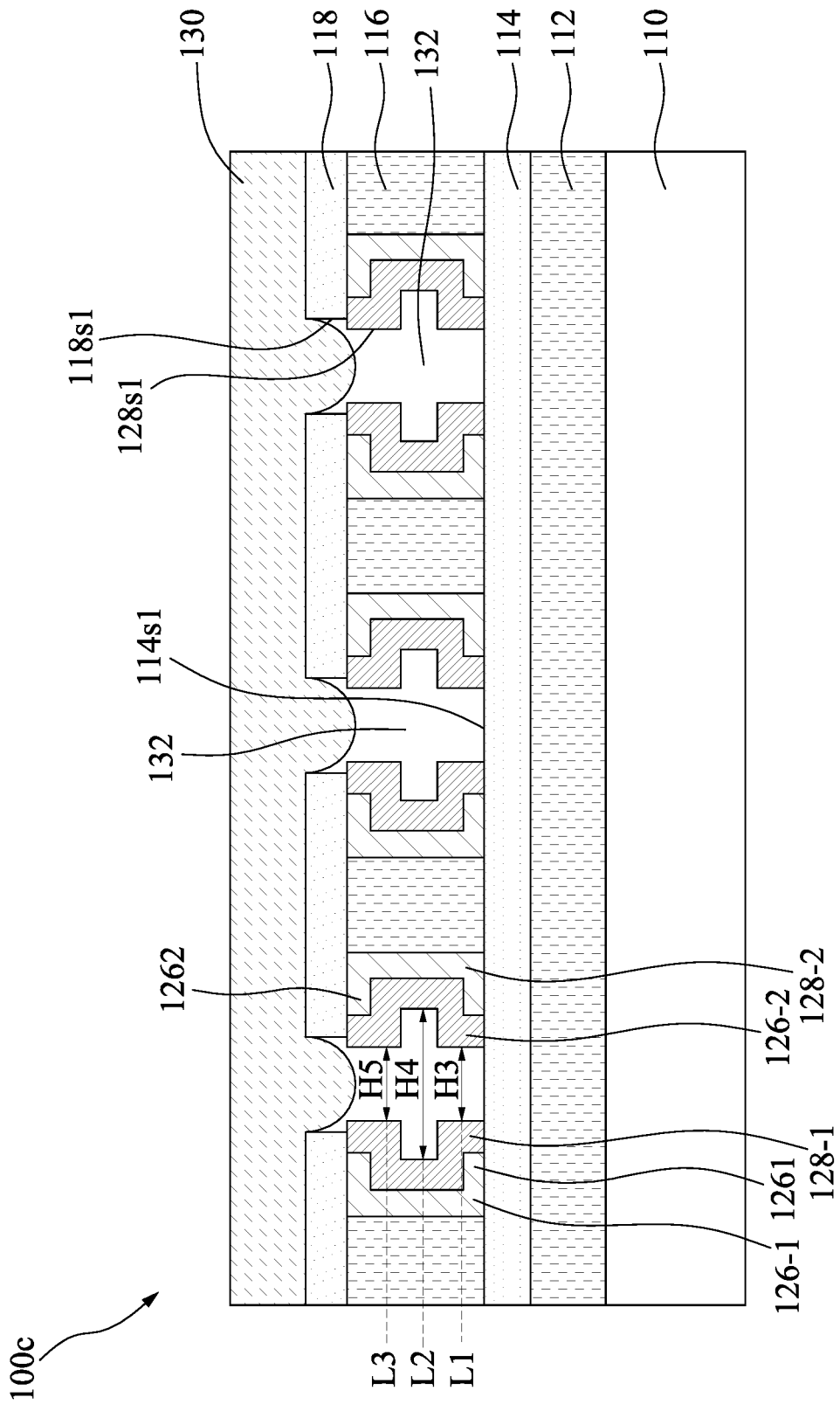
FIG. 3 is a cross-sectional view of a semiconductor device, in accordance with some embodiments of the present disclosure.

FIG. 3 is a cross-sectional view of a semiconductor device 100c, in accordance with some embodiments of the present disclosure. The semiconductor device 100c shown in FIG. 3 can be similar to the semiconductor device 100a shown in FIG. 1, differing in that the layer 126-1 (or 126-2) may have uneven horizontal dimensions.

In some embodiments, each of the layers 126-1 and 126-2 may have extending portions 1261 and 1262. In some embodiments, the extending portion 1261 may extend toward the air gap 132. In some embodiments, the extending portion 1262 may extend toward the air gap 132. In some embodiments, the extending portion 1261 may be disposed over the surface 114s1 of the dielectric layer 114. In some embodiments, the extending portion 1261 of the layer 126-1 may be disposed between the layer 128-1 and the dielectric layer 114. In some embodiments, the extending portion 1262 of the layer 126-1 may be disposed between the layer 128-1 and the dielectric layer 118. In some embodiments, the surface 128s1 of the layer 128-1 may be non-coplanar with the surface 118s1 of the layer 118. In some embodiments, the surface 128s1 of the layer 128-1 may exceed the surface 118s1 of the layer 118.

In some embodiments, the air gap 132 may have uneven horizontal dimensions. The air gap 132 may have a horizontal dimension H3 at a horizontal level L1. The air gap 132 may have a horizontal dimension H4 at a horizontal level L2. The air gap 132 may have a horizontal dimension H5 at a horizontal level L3. The horizontal level H2 may be higher than the horizontal level H1. The horizontal level H3 may be higher than the horizontal level H2. In some embodiments, the horizontal dimension H3 may be less than the horizontal dimension H4. In some embodiments, the horizontal dimension H5 may be less than the horizontal dimension H4. In some embodiments, the horizontal dimension H3 may be substantially the same as the horizontal dimension H5.

Figure 4:
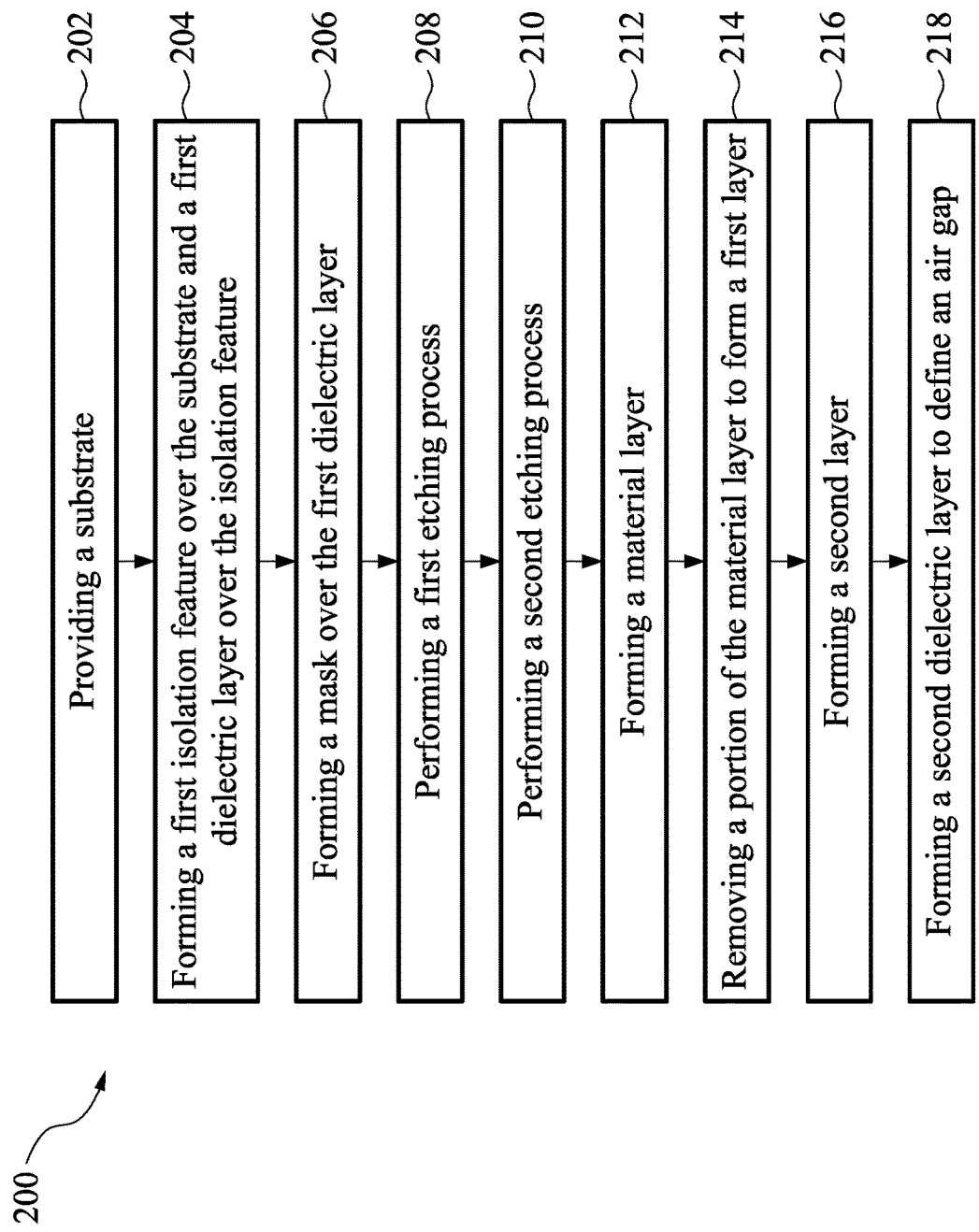
FIG. 4 is a flowchart illustrating a method of manufacturing a semiconductor device, in accordance with some embodiments of the present disclosure.

FIG. 4 is a flowchart illustrating a method 200 of manufacturing a semiconductor device, in accordance with some embodiments of the present disclosure.

The method 200 begins with operation 202 in which a substrate is provided. A first dielectric layer may be formed on or over the substrate. A second dielectric layer may be formed on or over the first dielectric layer. In some embodiments, the material of the first dielectric layer may be different from that of the second dielectric layer.

The method 200 continues with operation 204 in which a first isolation feature may be formed on or over the second dielectric layer. A third dielectric layer may be formed on or over the first isolation feature. In some embodiments, the material of the first isolation feature may be different from that of the third dielectric layer.

The method 200 continues with operation 206 in which a mask may be formed on or over the third dielectric layer. In some embodiments, the mask may include a photoresist. In some embodiments, the mask may define a plurality of openings. A first portion of the third dielectric layer may be exposed by the mask. A first portion of the first isolation feature may be exposed by the mask.

The method 200 continues with operation 208 in which a first etching process may be performed. In some embodiments, the first portion of the third dielectric layer may be removed. In some embodiments, the first portion of the first isolation feature may be removed. In some embodiments, a plurality of first openings may be formed. The upper surface of the second dielectric layer may be exposed to the first openings. In some embodiments, a second portion of the first isolation feature may be exposed to the first openings.

The method 200 continues with operation 210 in which a second etching process may be performed. The second etching process may have a selectivity with respect to the first isolation feature and the third dielectric layer. The second portion of the first isolation feature may be removed. A plurality of second openings may be formed. The second opening may be connected to the first opening. In some embodiments, a lateral surface of the first isolation feature may be recessed from the lateral surface of the third dielectric layer. In some embodiments, a lower surface of the third dielectric layer may be exposed to the second opening. An upper surface of the third dielectric layer may be exposed.

The method 200 continues with operation 212 in which a material layer may be formed. The material layer may include a semiconductor material or a conductive material. In some embodiments, the material layer may be formed on the lateral surface of the third dielectric layer. In some embodiments, the material layer may be formed on the lower surface of the third dielectric layer. In some embodiments, the material layer may be formed on the upper surface of the third dielectric layer. In some embodiments, the material layer may be formed on the lateral surface of the first isolation feature. In some embodiments, the material layer may be formed on the upper surface of the second dielectric layer.

The method 200 continues with operation 214 in which a portion of the material layer may be removed to form a first layer. In some embodiments, the material layer on the upper surface of the third dielectric layer may be removed. In some embodiments, the material layer on the lower surface of the third dielectric layer may be removed. In some embodiments, the material layer on the lateral surface of the third dielectric layer may be removed. In some embodiments, the material layer on the upper surface of the second dielectric layer may be removed. In some embodiments, the first layer may remain on the lateral surface of the first isolation feature.

The method 200 continues with operation 216 in which a second layer may be formed on the first layer. In some embodiments, the second layer may be selectively formed on the lateral surface of the first layer. As a result, an interconnection structure, including the first layer and the second layer, may be produced.

The method 200 continues with operation 218 in which a fourth dielectric layer may be formed on the third dielectric layer. In some embodiments, an air gap may be formed. The air gap may be surrounded by the fourth dielectric layer, the second layer, and the second dielectric layer. As a result, a semiconductor device may be produced.

The method 200 is merely an example, and is not intended to limit the present disclosure beyond what is explicitly recited in the claims. Additional operations can be provided before, during, or after each operation of the method 200, and some operations described can be replaced, eliminated, or reordered for additional embodiments of the method. In some embodiments, the method 200 can include further operations not depicted in FIG. 4. In some embodiments, the method 200 can include one or more operations depicted in FIG. 4.

FIG. 5A-5I illustrates one or more stages of an example of a method for manufacturing a semiconductor device according to some embodiments of the present disclosure.

Figure 5A:
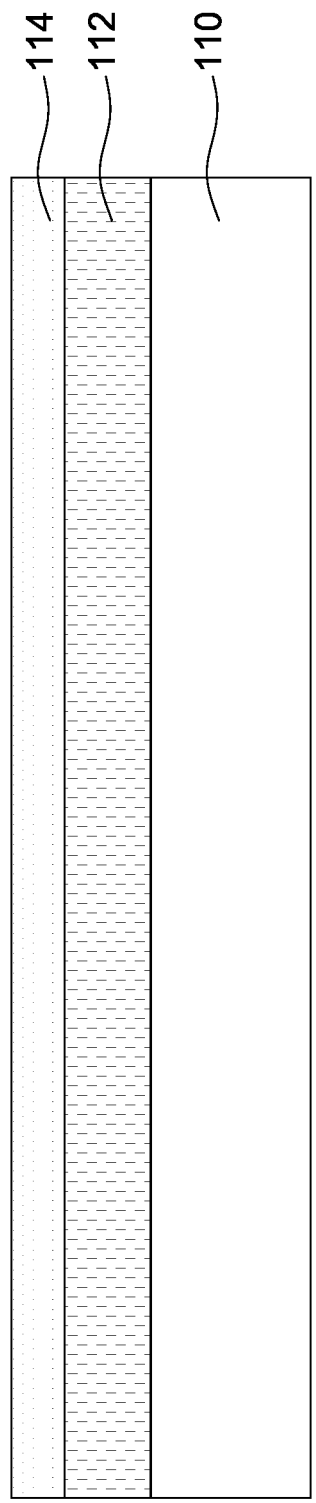
FIG. 5A illustrates one or more stages of an example of a method for manufacturing a semiconductor device according to some embodiments of the present disclosure.

Referring to FIG. 5A, a substrate 110 may be provided. A dielectric layer 112 may be formed on or over the substrate 110. A dielectric layer 114 may be formed on or over the dielectric layer 112. Each of the dielectric layer 112 and the dielectric layer 114 may be formed by chemical vapor deposition (CVD), atomic layer deposition (ALD), physical vapor deposition (PVD), low-pressure chemical vapor deposition (LPCVD), or other suitable processes. In some embodiments, the material of the dielectric layer 112 may be different from that of the dielectric layer 114.

Figure 5B:
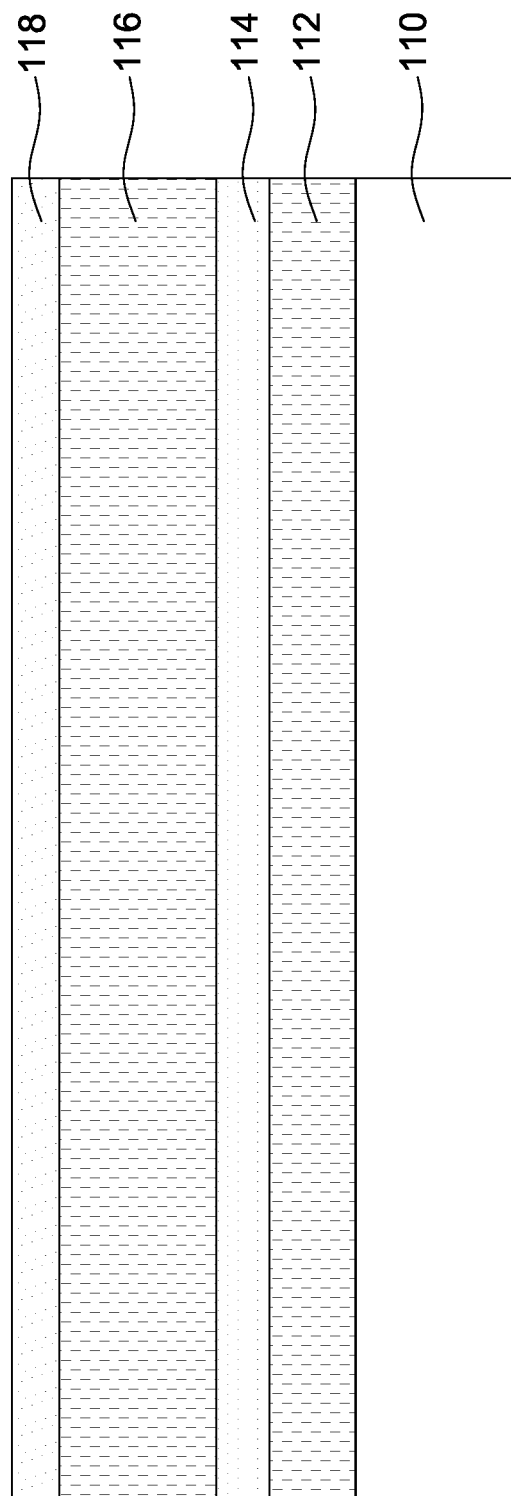
FIG. 5B illustrates one or more stages of an example of a method for manufacturing a semiconductor device according to some embodiments of the present disclosure.

Referring to FIG. 5B, a dielectric layer 116 may be formed on or over the dielectric layer 114. A dielectric layer 118 may be formed on or over the dielectric layer 116. Each of the dielectric layer 116 and the dielectric layer 118 may be formed by chemical vapor deposition, atomic layer deposition, physical vapor deposition, low-pressure chemical vapor deposition, or other suitable processes. In some embodiments, the material of the dielectric layer 116 may be different from that of the dielectric layer 118.

Figure 5C:
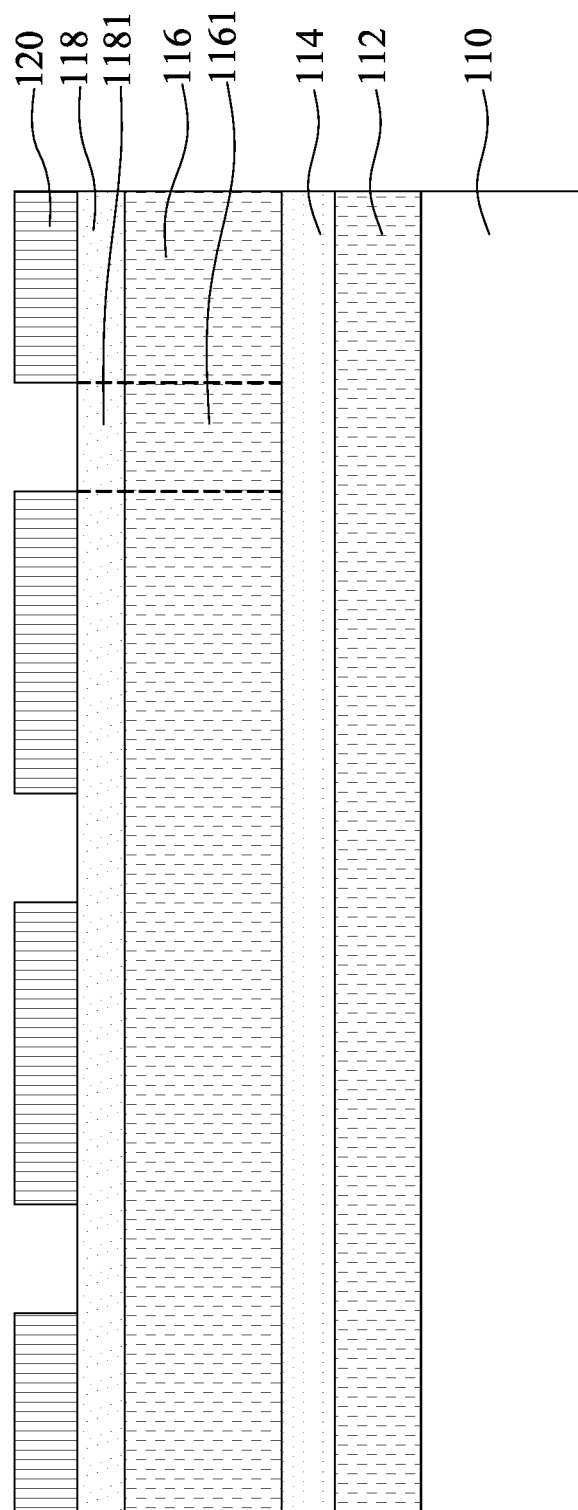
FIG. 5C illustrates one or more stages of an example of a method for manufacturing a semiconductor device according to some embodiments of the present disclosure.

Referring to FIG. 5C, a mask 120 may be formed on or over the dielectric layer 118. In some embodiments, the mask 120 may include a photoresist. The mask 120 may be formed by, for example, a photolithography process. The photolithography process may include photoresist coating (e.g., spin-on coating), soft baking, mask aligning, exposure, post-exposure baking, developing the photoresist, rinsing and drying (e.g., hard baking). In some embodiments, the mask 120 may define a plurality of openings. A portion 1181 of the dielectric layer 118 may be exposed by the mask 120. A portion 1161 of the dielectric layer 116 may be exposed by the mask 120.

Figure 5D:
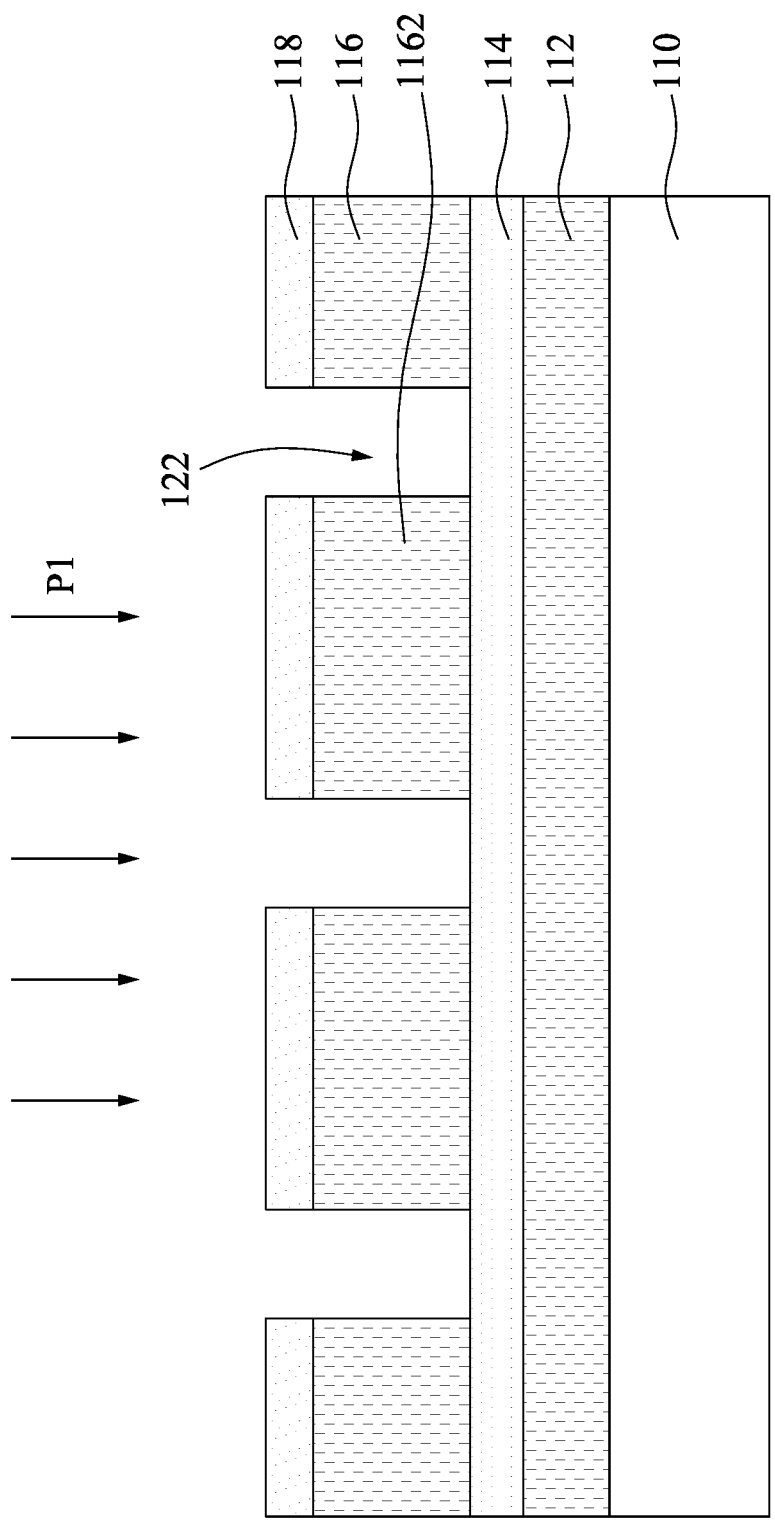
FIG. 5D illustrates one or more stages of an example of a method for manufacturing a semiconductor device according to some embodiments of the present disclosure.

Referring to FIG. 5D, an etching process P1 may be performed. The etching process P1 may include dry etching, wet etching, or other suitable techniques. In some embodiments, the portion 1181 of the dielectric layer 118 may be removed. In some embodiments, the portion 1161 of the dielectric layer 116 may be removed. In some embodiments, a plurality of openings 122 may be formed. The upper surface of the dielectric layer 114 may be exposed to the openings 122. In some embodiments, a portion 1162 of the dielectric layer 116 may be exposed to the openings 122.

Figure 5E:
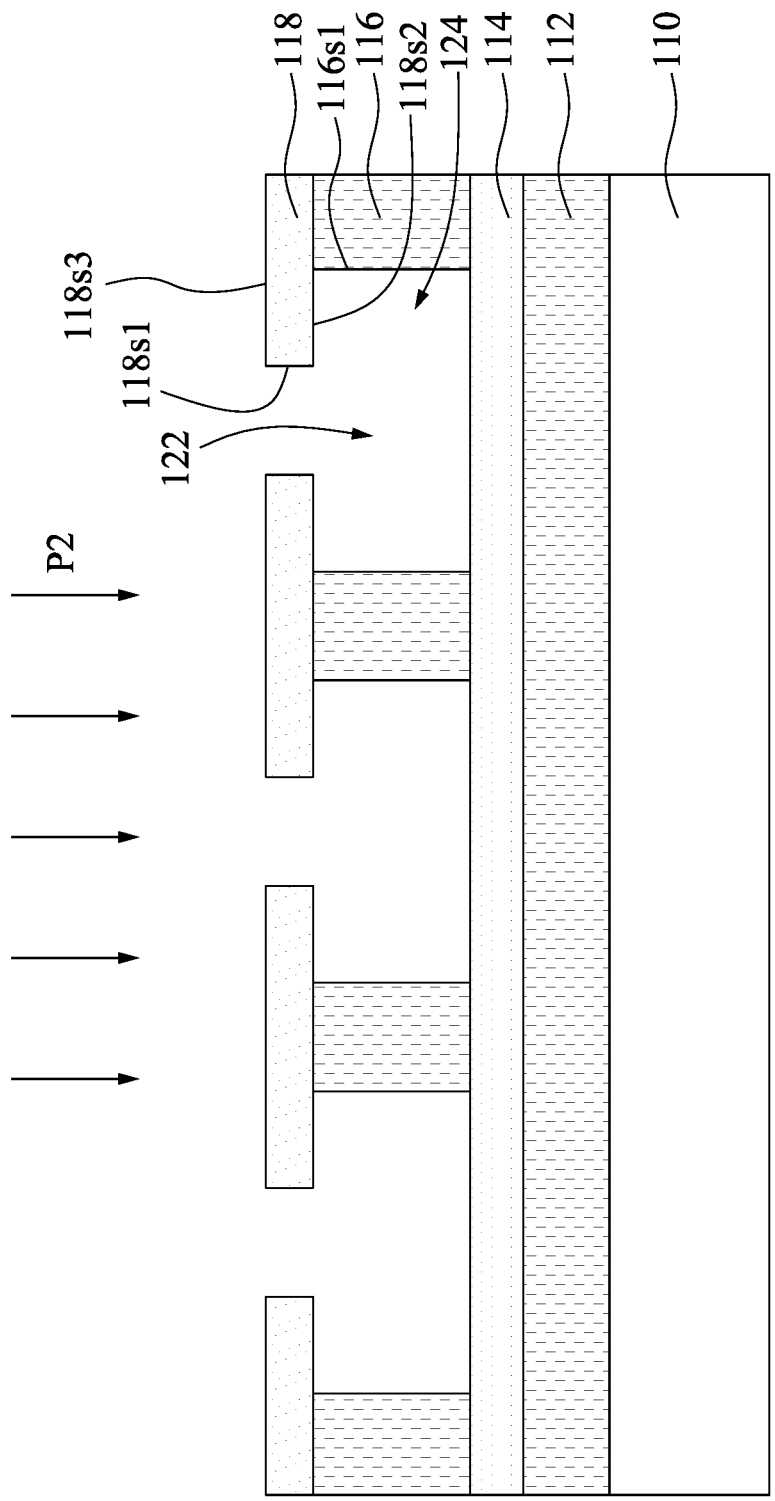
FIG. 5E illustrates one or more stages of an example of a method for manufacturing a semiconductor device according to some embodiments of the present disclosure.

Referring to FIG. 5E, an etching process P2 may be performed. The etching process P2 may have a selectivity with respect to the dielectric layer 116 and the dielectric layer 118. The portion 1162 of the dielectric layer 116 may be removed. A plurality of openings 124 may be formed. The opening 124 may be connected to the opening 122. In some embodiments, a surface $116s1$ of the dielectric layer 116 may be recessed from the surface $118s1$ of the dielectric layer 118. In some embodiments, a surface $118s2$ of the dielectric layer 118 may be exposed to the opening 124. A surface $118s3$ of the dielectric layer 118 may be exposed.

Figure 5F:
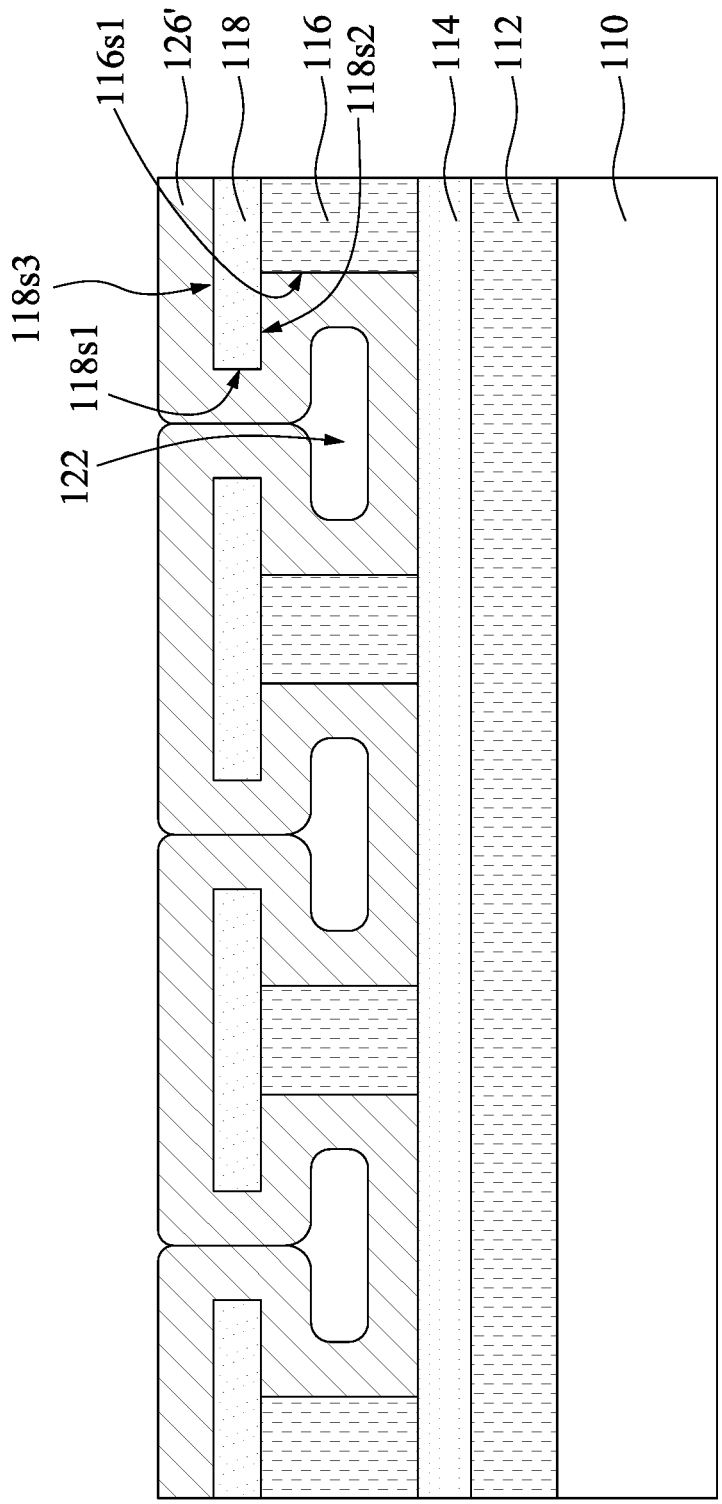
FIG. 5F illustrates one or more stages of an example of a method for manufacturing a semiconductor device according to some embodiments of the present disclosure.

Referring to FIG. 5F, a material layer 126' may be formed. The material layer 126' may include a semiconductor material or a conductive material. In some embodiments, the material layer 126' may be formed on the surface $118s1$ of the dielectric layer 118. In some embodiments, the material layer 126' may be formed on the surface $118s2$ of the dielectric layer 118. In some embodiments, the material layer 126' may be formed on the surface $118s3$ of the dielectric layer 118. In some embodiments, the material layer 126' may be formed on the surface $116s1$ of the dielectric layer 116. In some embodiments, the material layer 126' may be formed on the upper surface of the dielectric layer 114. In some embodiments, the material layer 126' may be formed by chemical vapor deposition, atomic layer deposition, physical vapor deposition, plasma-enhanced chemical vapor deposition, low-pressure chemical vapor deposition, or other suitable processes.

Figure 5G:
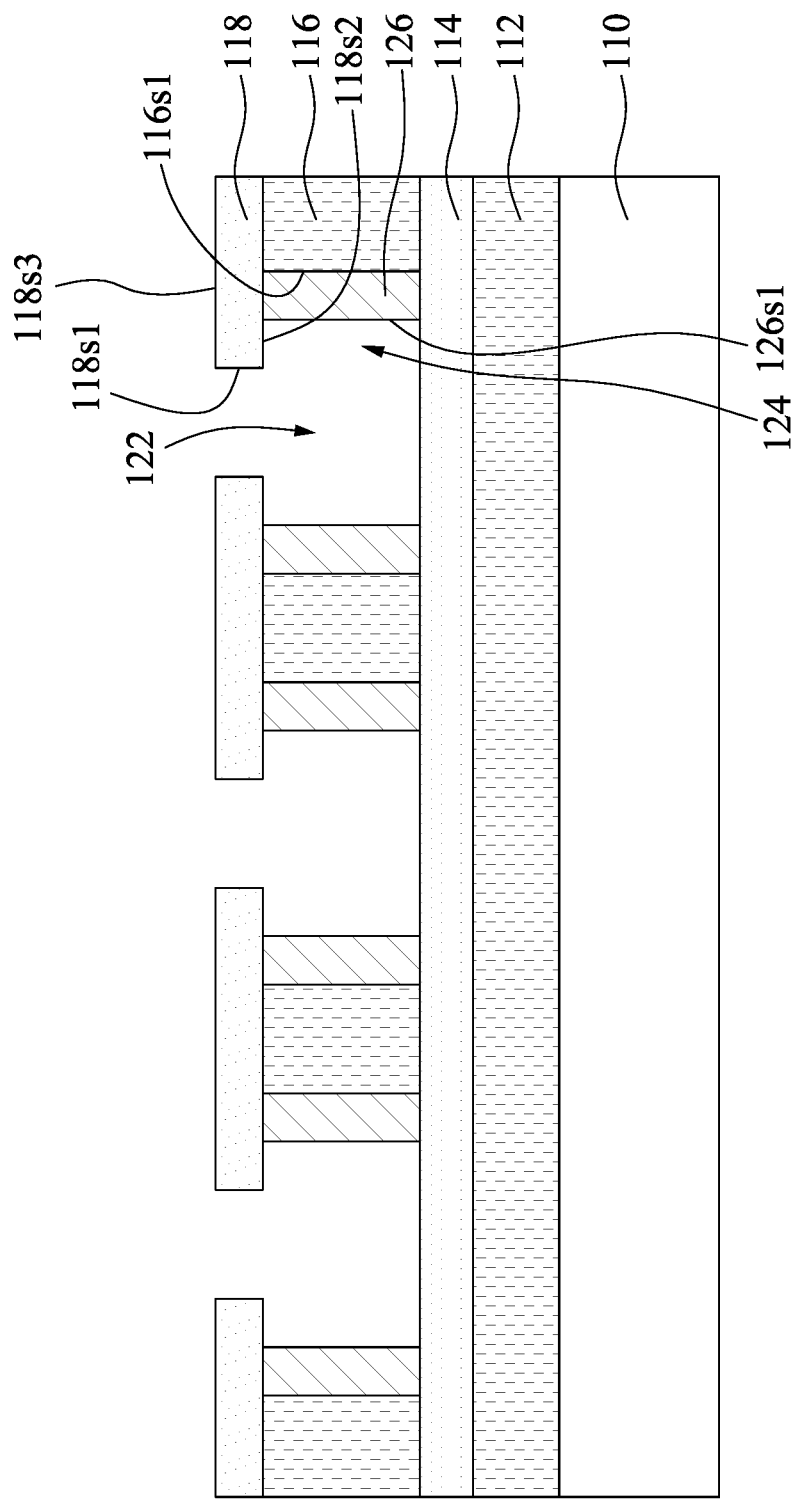
FIG. 5G illustrates one or more stages of an example of a method for manufacturing a semiconductor device according to some embodiments of the present disclosure.

Referring to FIG. 5G, a portion of the material layer 126' may be removed to form a layer 126. In some embodiments, the material layer 126' on the surface $118s3$ of the dielectric layer 118 may be removed. In some embodiments, the material layer 126' on the surface $118s2$ of the dielectric layer 118 may be removed. In some embodiments, the material layer 126' on the surface $118s1$ of the dielectric layer 118 may be removed. In some embodiments, the material layer 126' on the upper surface of the dielectric layer 114 may be removed. In some embodiments, the layer 126 may remain on the surface $116s1$ of the dielectric layer 116. The material layer 126' may be removed by an etching process.

Figure 5H:
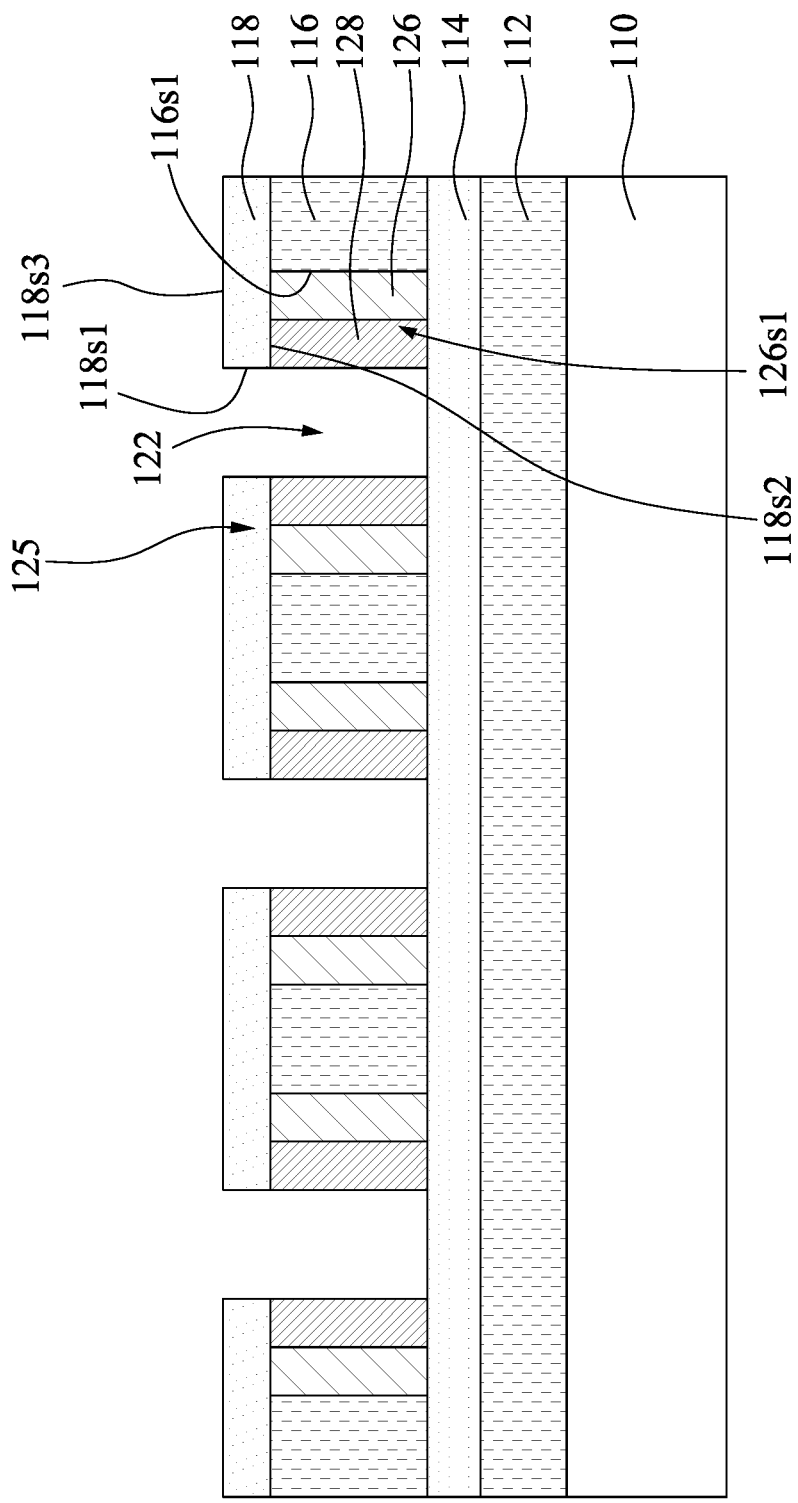
FIG. 5H illustrates one or more stages of an example of a method for manufacturing a semiconductor device according to some embodiments of the present disclosure.

Referring to FIG. 5H, a layer 128 may be formed on the layer 126. In some embodiments, the layer 128 may be selectively formed on the surface $126s1$ of the layer 126. As a result, an interconnection structure 125, including the layer 126 and the layer 128, may be produced.

Figure 5I:
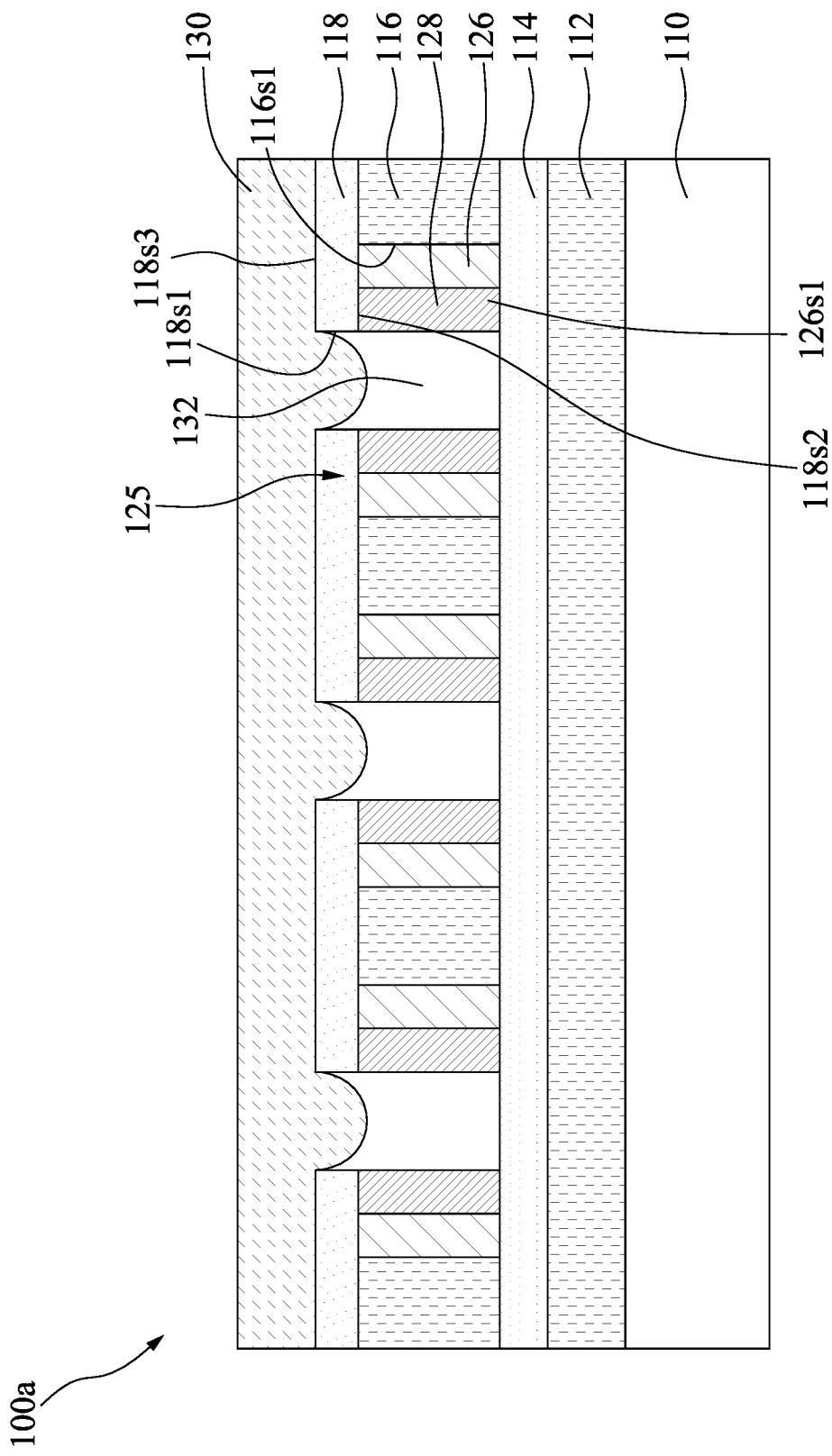
FIG. 5I illustrates one or more stages of an example of a method for manufacturing a semiconductor device according to some embodiments of the present disclosure.

Referring to FIG. 5I, a dielectric layer 130 may be formed on the dielectric layer 118. In some embodiments, an air gap 132 may be formed. The dielectric layer 130 may be formed by chemical vapor deposition, atomic layer deposition, physical vapor deposition, flowable chemical vapor deposition, plasma-enhanced chemical vapor deposition, low-pressure chemical vapor deposition, or other suitable processes. An air gap 132 may be formed. The air gap 132 may be surrounded by the dielectric layer 130, the layer 128, and the dielectric layer 114. As a result, a semiconductor device, such as the semiconductor device as shown in FIG. 1, may be produced.

One aspect of the present disclosure provides a semiconductor device. The semiconductor device includes a substrate, an interconnection structure, a first isolation feature, and a second isolation feature. The interconnection structure has a first lateral surface and a second lateral surface. The first isolation feature is disposed on the first lateral surface of the interconnection structure. The second isolation feature is disposed on the second lateral surface of the interconnection structure. The first isolation feature is different from the second isolation feature.

Another aspect of the present disclosure provides another a first dielectric layer, a first interconnection structure, and a second interconnection structure. The first dielectric layer is disposed over the substrate. The first interconnection structure is disposed over the first dielectric layer. The second interconnection structure is disposed over the first dielectric layer. The first interconnection structure is spaced apart from the second interconnection structure by an air gap.

Another aspect of the present disclosure provides a method for manufacturing a semiconductor device. The method includes: providing a substrate; forming a first dielectric layer over the substrate; forming a second dielectric layer over the first dielectric layer; patterning the first dielectric layer and the second dielectric layer to form an opening; forming an interconnection structure within the opening; and forming a third dielectric layer to form an air gap surrounded by the interconnection structure and the third dielectric layer.

The embodiments of the present disclosure a semiconductor device with a composite isolation feature around an interconnection structure. In this embodiment, the interconnection structure is made of at least two different materials. The interconnection structure may be proximal to two mediums with different dielectric constants. Such an asymmetry structure may be applied in semiconductor devices, such as a memory device, to control electrical properties.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device, comprising:
a substrate;
a first dielectric layer disposed over the substrate;

a first electrically conductive structure disposed over the first dielectric layer;

a second electrically conductive structure disposed over the first dielectric layer;

a second dielectric layer, being a single layer disposed over and in direct contact with the first electrically conductive structure, wherein a lateral surface of the second dielectric layer is exposed to an air gap;

wherein the first electrically conductive structure is spaced apart from the second electrically conductive structure by the air gap;

wherein the lateral surface of the second dielectric layer is noncoplanar with a lateral surface of the first electrically conductive structure.

2. The semiconductor device of claim 1, wherein the first electrically conductive structure comprises a first layer and a second layer different from the first layer.

3. The semiconductor device of claim 2, wherein the first layer comprises a semiconductor material.

4. The semiconductor device of claim 3, wherein the second layer comprises a semiconductor material.

5. The semiconductor device of claim 2, further comprising:

an isolation feature disposed over the first dielectric layer, wherein the first layer is in contact with the isolation feature, and the second layer is exposed to the air gap.

6. The semiconductor device of claim 5, wherein the second electrically conductive structure comprises a third layer exposed to the air gap, and a material of the third layer is the same as that of the second layer.

7. The semiconductor device of claim 1, further comprising:

a third dielectric layer disposed over the second dielectric layer, wherein a lower surface of the third dielectric layer is exposed to the air gap.

8. The semiconductor device of claim 7, wherein the third dielectric layer has a protruding portion protruding toward the air gap.

9. The semiconductor device of claim 1, wherein the lateral surface of the second dielectric layer is substantially coplanar with a lateral surface of the first electrically conductive structure.

10. A semiconductor device, comprising:

a substrate;

a first dielectric layer disposed over the substrate:

a first electrically conductive structure disposed over the first dielectric layer;

a second electrically conductive structure disposed over the first dielectric layer, a second dielectric layer, being a single layer, disposed over and in direct contact with the first electrically conductive structure, wherein a lateral surface of the second dielectric layer is exposed to an air gap;

wherein the first electrically conductive structure is spaced apart from the second electrically conductive structure by the air gap:

wherein a portion of a top surface of the first dielectric layer is exposed to the air gap.

\* \* \* \* \*